United States Patent
Katsumata

(10) Patent No.: US 6,436,482 B2
(45) Date of Patent: *Aug. 20, 2002

(54) SUBSTRATE HEATING METHOD

(75) Inventor: Mikio Katsumata, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 8 days.

(21) Appl. No.: 08/769,899

(22) Filed: Dec. 19, 1996

(30) Foreign Application Priority Data

Dec. 20, 1995 (JP) .............................................. 7-331411

(51) Int. Cl.$^7$ .............................. C08J 7/18; B05D 3/02; B05D 3/06
(52) U.S. Cl. ........................ 427/493; 427/504; 427/510; 427/552; 427/553; 427/555; 430/198; 430/330; 430/346; 430/942
(58) Field of Search ................................. 427/493, 488, 427/504, 510, 511, 542, 554, 555, 551, 552, 557, 521, 522, 553; 118/641, 642, 643; 430/5, 198, 330, 346, 942, 945

(56) References Cited

U.S. PATENT DOCUMENTS

| | | | | |
|---|---|---|---|---|
| 2,117,200 A | * | 5/1938 | Miller ........................ 118/643 |
| 2,236,398 A | * | 3/1941 | Drummond ................. 118/643 |
| 3,364,587 A | * | 1/1968 | Norton et al. .............. 118/641 |
| 3,716,018 A | * | 2/1973 | Ohta et al. .................. 118/641 |
| 4,096,290 A | * | 6/1978 | Fredericks ................. 427/493 |
| 4,242,566 A | * | 12/1980 | Scribner ..................... 118/641 |
| 4,246,298 A | * | 1/1981 | Guarnery et al. ........... 427/493 |
| 4,342,793 A | * | 8/1982 | Skinner et al. ............. 427/493 |
| 4,342,794 A | * | 8/1982 | Völker et al. ............... 118/643 |
| 4,367,037 A | * | 1/1983 | Nishikawa .................. 118/641 |
| 4,459,320 A | * | 7/1984 | Fefferman ................... 427/493 |
| 4,463,704 A | * | 8/1984 | Farnam ....................... 118/643 |
| 4,479,983 A | * | 10/1984 | Appelt et al. ............... 427/493 |
| 4,897,337 A | * | 1/1990 | Kato et al. .................. 430/330 |
| 5,015,552 A | * | 5/1991 | Tamura et al. ............. 430/330 |
| 5,213,849 A | * | 5/1993 | Maner ........................ 427/493 |
| 5,275,237 A | * | 1/1994 | Rolfson et al. ............ 430/330 |
| 5,275,663 A | * | 1/1994 | Kim et al. .................. 118/643 |
| 5,290,608 A | * | 3/1994 | Grunwald et al. .......... 427/493 |
| 5,296,271 A | * | 3/1994 | Swirbel et al. ............. 427/493 |
| 5,299,362 A | * | 4/1994 | Beisswanger et al. ...... 118/643 |
| 5,391,458 A | * | 2/1995 | Conrad ....................... 430/330 |
| 5,474,877 A | * | 12/1995 | Suzuki ....................... 430/330 |
| 5,486,449 A | * | 1/1996 | Hosono et al. ............. 430/330 |
| 5,496,406 A | * | 3/1996 | Baldinger ................... 118/643 |
| 5,580,614 A | * | 12/1996 | Amberg-Schwab et al. .......................... 427/493 |

(List continued on next page.)

Primary Examiner—Marianne Padgett
(74) Attorney, Agent, or Firm—Sonnenschein, Nath & Rosenthal

(57) ABSTRACT

In the heating of a substrate in a lithographic process, temperature conditions for heating a substrate on which a resist is formed exert a large influence upon the pattern dimensions, and the pattern dimensions vary greatly in the heating from only one of the surfaces of the substrate. There is provided a substrate heating apparatus for heating a substrate before or after irradiation of light for performing a pattern by using a photosensitive material formed on a substrate or by using a material which is photosensitive to charged particles formed on the substrate. The substrate heating apparatus includes an upper heater which serves as a heat source for heating the substrate from the top surface thereof, a lower heater which serves as a heat source for heating the substrate from the bottom surface thereof, and a heat-conducting heater block provided on the lower heater, on which heater block the substrate is placed, making it possible to individually set the temperatures of the upper and lower heaters.

6 Claims, 8 Drawing Sheets

U.S. PATENT DOCUMENTS

| | | | | |
|---|---|---|---|---|
| 5,631,120 A | * | 5/1997 | Swirbel et al. | 430/330 |
| 5,633,040 A | * | 5/1997 | Toshima et al. | 430/330 |
| 5,641,715 A | * | 6/1997 | Okamoto | 430/330 |
| 5,667,942 A | * | 9/1997 | Nakao et al. | 430/330 |
| 5,672,393 A | * | 9/1997 | Bachmann et al. | 427/493 |
| 5,674,659 A | * | 10/1997 | Matsuo et al. | 430/330 |
| 5,716,740 A | * | 2/1998 | Shiba et al. | 427/493 |
| 5,766,824 A | * | 6/1998 | Batchelder et al. | 430/330 |
| 5,798,203 A | * | 8/1998 | Haraguchi et al. | 430/330 |

* cited by examiner

SUBSTRATE HEATING METHOD

BACKGROUND OF THE INVENTION

1. Field of the Invention

The present invention relates to a substrate heating apparatus, a substrate heating method, a semiconductor integrated circuit device, a photomask and a liquid-crystal device.

2. Description of the Related Art

As a heating method of a conventional substrate heating apparatus, an oven-type heating method or a hot-plate-type heating method is employed. A substrate heating apparatus having an oven-type heating method of these methods is designed to indirectly heat a workpiece to be heated, for example, a substrate in a heating atmosphere inside a heat insulation chamber which serves also to shield heat on the precondition that a plurality of substrates are heated at a time.

On the other hand, in recent years, a substrate heating apparatus employing a hot-plate-type heating method has been generally used due to the necessity of forming what is commonly called "inline processing" with other apparatuses for the purpose of reducing the adhesion of particles onto a substrate and without human intervention.

An example of a conventional substrate heating apparatus employing a hot-plate-type heating method will now be described with reference to the schematic view of FIG. 1.

As shown in FIG. 1, a substrate heating apparatus 101 basically comprises a heater 111 and a heater block 112 formed on the heater 111.

In order to heat a substrate 121 by using the substrate heating apparatus 101, the substrate 121 is placed on the heater block 112 and the heater block 112 is heated by the heater 111 so as to heat the substrate 121 from the rear surface of the substrate 121. Therefore, the substrate 121 is heated via the heater block 112 by the heater 111.

In recent years, resist materials have been improved in order to form patterns finer than those of the known art. For example, a resist material utilizing a catalytic reaction during heating time has been developed, and such a resist material has been used in a semiconductor device manufacturing process. In such resist materials, acid generated in a resist material due to irradiation of light or irradiation of a charged particle beam reacts with a functional group having a high reactivity to acid due to heating after the irradiation, and the solubility characteristic of the resist material with respect to the developing solution varies, thus forming a pattern. The above-mentioned resist is generally called a chemical amplification-type resist.

However, use of a chemical amplification-type resist causes temperature conditions for heating after exposure or after the charged particle beam is irradiated to affect the reaction speed. For example, as shown in the relation view of FIG. 14 between the line width variation amount of a pattern and heating temperature, it can be seen that the temperature conditions during the heating period cause the line width of the pattern to vary. Therefore, presence of a temperature distribution on the surface of the substrate brings about undesirable results in high-precision pattern formation.

In a conventional oven-type substrate heating apparatus, since the heating chamber is opened and closed when a heating process is started, the reproducibility of temperature and the controllability of the temperature inside the heating chamber are low. Also, since the substrate is indirectly heated, the temperature distribution under the substrate surface is considerably unfavorable. Further, also in the conventional substrate heating apparatus employing a hot-plate-type type heating method, the temperature distribution of the substrate surface is unfavorable. For these reasons, it is not possible to form high-precision patterns.

An example of the above will be described below with reference to FIG. 15. In FIG. 15, the vertical axis shows differences from the reference dimension (line width=1.0 $\mu$m) of the pattern, i.e., dimensional variations of the pattern, and the horizontal axis shows measurement positions with respect to the effective area (a 110 mm square) in a photomask.

The patterns measured in the example are formed by the processes described below. That is, an acid catalytic reaction-type resist is coated on a glass substrate having a thickness of 6 mm and heated to remove a resist solvent. Then, the resist film is irradiated with an electron beam, after which the glass substrate is heated by the substrate heating apparatus of a hot-plate-type heating method. Then, a development process is performed to form a pattern.

The dimensional variations of the resist pattern in this case were $3\sigma=0.045$ $\mu$m.

It can be seen in FIG. 15 that (a) the dimensional variation varies from a positive variation to a negative variation toward a particular direction (the front side in the drawing in this example). That is, since heating is performed only from the rear surface of the glass substrate in the substrate heating apparatus of a hot-plate-type heating method, the pattern dimension distribution depends upon the parallel relation between the heater block and the substrate. For this reason, when the parallel relation is poor, variations in pattern dimensions having directivity occur.

Also, (b) a large variation of the pattern dimension occurs near the outer peripheral portion of the substrate. This is caused by the heat loss which occurs due to the convection of air.

Such phenomena as the above-described (a) and (b) appear conspicuously in cases where thermal conductivity is as low as in a glass substrate and the thermal capacity increases with the thickness of the substrate. In particular, in the manufacture of photomasks, it is practically impossible to obtain patterns having high dimensional precision.

Further, (d) also in a silicon substrate having relatively high thermal conductivity, problems similar to those described above have been reported [47th Symposium On Semiconductor Integrated-Circuits, Proceeding Papers (1994), Yamamoto et al., P60], presenting a considerable problem in a manufacturing process.

SUMMARY OF THE INVENTION

The present invention has been achieved to solve the above-described problems. It is an object of the present invention to provide a substrate heating apparatus and a substrate heating method which excel in achieving uniformity of pattern dimension and which excel in reducing dimensional variations in the portion under the substrate surface, and to provide a semiconductor integrated circuit device, a photomask, and a liquid-crystal display device, in each of which each substrate is heated by the substrate heating apparatus.

To achieve the above-described objects, according to the present invention there is provided a substrate heating apparatus, a substrate heating method, a semiconductor integrated circuit device, a photomask and a liquid-crystal device.

More specifically, the substrate heating apparatus used in a manufacturing process for semiconductor devices, heats a substrate before or after irradiation of light for forming a pattern by using a photosensitive material formed on a substrate, or before or after irradiation of a charged particle beam for forming a pattern by using a material that is sensitive to charge particles, formed on a substrate. The substrate heating apparatus comprises a first heater which is a heat source for heating a substrate from the obverse surface thereof and a second heater which is a heat source for heating the substrate from the rear surface thereof, wherein the temperatures of the first and second heaters can be set individually.

The surface of the first heater on the substrate must be spaced from the surface of this substrate, and the space is set to be 10 mm or smaller. It is preferable that a recessed portion be formed on at least a part of the surface of the first heater on the substrate side. Further, the second heater comprises a third heater which constitutes the central portion of the second heater and the area adjacent to the central portion of the second heater, and a fourth heater disposed around the side peripheral portion of the third heater.

In the substrate heating apparatus, the first heater which heats a substrate from the obverse surface thereof and the second heater which heats the substrate from the rear surface thereof are provided; therefore, it becomes possible to heat the substrate from both sides. Therefore, heat loss on the surface of the substrate is suppressed, and the surface temperature of the substrate reaches a stable temperature at an early stage.

Further, since the temperatures of the first and second heaters can be set individually, it becomes possible to set the surface temperature of the substrate at any desired value.

Further, since a recessed portion is formed in at least a part of the surface of the first heater on the substrate side, it is possible to obtain uniform heat radiation on the surface of the substrate. Therefore, the surface of the substrate is uniformly heated.

Further, since the second heater comprises a third heater which constitutes the central portion of the second heater and the area adjacent to the central portion of the second heater, and a fourth heater disposed around the side peripheral portion of the third heater, heating from the rear surface of the substrate is controlled so that the temperature of the surface of the substrate becomes uniform when the substrate is heated to an increased temperature.

The substrate heating method comprises the step of heating a substrate before or after irradiation of light for forming a pattern by using a photosensitive material formed on the substrate, or before or after irradiation of a charged particle beam for forming a pattern by using a material that is sensitive to charge particles, formed on the substrate, wherein the substrate is heated at a temperature $T_1$ from the obverse surface thereof and heated at a temperature $T_2$ from the rear surface thereof into a temperature state independently of the heating from the obverse surface of the substrate. The temperatures $T_1$ and $T_2$ should preferably satisfy the relation of $0.7 \leq T_1/T_2 \leq 1.6$.

In the above-described substrate heating method, since the substrate is heated at a temperature $T_2$ from the rear surface thereof and the substrate is heated at a temperature $T_1$ from the obverse surface to a temperature state independent of the heating from the rear surface of the substrate, heat loss on the surface of the substrate is suppressed, and the surface temperature of the substrate reaches a stable temperature at an early stage. Further, the surface temperature of the substrate reaches a desired temperature, and a desired temperature distribution is formed by appropriately setting the ratio of temperature $T_1$ to temperature $T_2$.

Further, since the temperatures $T_1$ and $T_2$ are set so as to satisfy the relation of $0.7 \leq T_1/T_2 \leq 1.6$, dimensional variations in the pattern are reduced to less than conventional dimensional variations in a pattern because the surface of the substrate is heated uniformly.

When the temperatures are set to $T_1/T_2 < 0.7$, since the temperature $T_1$ on the obverse surface of the substrate becomes much lower than the temperature $T_2$ on the rear surface of the substrate, the effect of suppressing heat loss from the surface of the substrate tends to decrease. Also, when the temperatures are set to $1.6 < T_1/T_2$, the temperature $T_2$ on the rear surface of the substrate becomes very low and it becomes difficult to obtain a stable substrate surface temperature distribution for a substrate having a large thermal capacity.

The semiconductor integrated-circuit device is formed by heating a substrate in a lithographic process conducted in the manufacture of semiconductor integrated-circuit devices by using a substrate heating apparatus which comprises a first heater for heating a substrate from the obverse surface thereof, from which a semiconductor integrated-circuit device is formed, and a second heater for heating the substrate from the rear surface thereof and which is capable of individually setting the temperatures of the first and second heaters.

In the semiconductor integrated-circuit device, since the substrate is heated in a lithographic process in the manufacture of semiconductor integrated-circuit devices using a substrate heating apparatus which heats a substrate from above and below, the portion under the surface of the substrate is heated almost uniformly, and therefore, dimensional variations in the pattern are reduced. Therefore, since a high-precision pattern can be formed, variations in the electrical characteristics due to dimensional variations in the pattern are reduced.

The photomask is formed by heating a substrate in a lithographic process conducted in the manufacture of photomasks by using a substrate heating apparatus which comprises a first heater for heating a substrate which constitutes a photomask from the obverse surface thereof and a second heater for heating the substrate from the rear surface thereof and which is capable of individually setting the temperatures of the first and second heaters.

In the photomask, since the substrate is heated in a lithographic process in the manufacture of photomasks by using a substrate heating apparatus for heating a substrate which constitutes the photomask from both sides thereof, the portion under the surface of the substrate is heated almost uniformly. Therefore, dimensional variations in the pattern can be reduced.

The liquid-crystal display device is formed by heating a substrate in a lithographic process conducted in the manufacture of liquid-crystal display devices by using a substrate heating apparatus which comprises a first heater for heating a substrate which constitutes a liquid-crystal display device from the obverse surface thereof and a second heater for heating the substrate from the rear surface thereof and which is capable of individually setting the temperatures of the first and second heaters.

In the liquid-crystal display device, since a substrate is heated in a lithographic process in the manufacture of liquid-crystal display devices by using a substrate heating apparatus for heating a substrate which constitutes a liquid-crystal display device from both sides of the substrate, the portion under the surface of the substrate is heated almost uniformly and therefore, dimensional variations in the pattern are reduced. Therefore, since a high-precision pattern can be formed, variations in the electrical characteristics due to dimensional variations in the pattern are reduced.

The above and further objects, aspects and novel features of the invention will become more apparent from the following detailed description when read in connection with the accompanying drawings.

DESCRIPTION OF THE PREFERRED EMBODIMENTS

A first embodiment of a substrate heating apparatus of the present invention will be described below with reference to the schematic view of FIG. 2.

Figure 2:
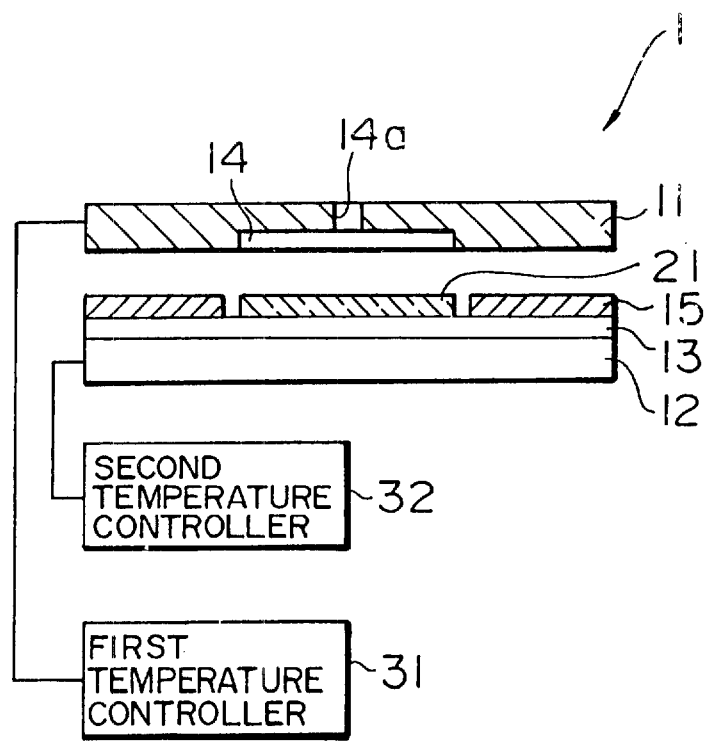
FIG. 2 is a schematic view of a first embodiment of a substrate heating apparatus of the present invention.

Shown in FIG. 2 is a substrate heating apparatus 1 for heating a substrate 21 before and after irradiation of light which forms a pattern by using a photosensitive material formed on the substrate 21, or before and after irradiation of charge particles which form a pattern by using a material which is sensitive to charge particles formed on the substrate 21.

Referring to FIG. 2, the basic arrangement of the substrate heating apparatus 1 will be described below.

A first heater 11 is disposed which serves as a heat source for heating the substrate 21 from the obverse surface thereof. The first heater 11, for example, has pattern wiring arranged on the entire surface thereof on the heating surface side.

Hereinafter, the surface of the substrate 21 refers to the surface of one side of the substrate 21, and the other surface of the substrate 21 refers to the rear surface. The obverse surface and the rear surface are referred to as both surfaces.

Further provided is a second heater 12 which serves as a heat source for heating the substrate 21 from the rear surface thereof. The second heater 12, for example, has pattern wiring arranged on the entire surface thereof on the heating surface side.

In the substrate heating apparatus 1, a substrate 21 is placed on the second heater 12, and a heater block 13 made from a heat-conducting material for uniformly heating the placed substrate 21 is provided. The heater block 13 is formed from, for example, a material having a high thermal conductivity, a copper plate having a thickness of 20 mm being used in this example.

The first heater 11 is placed in a state in which the distance to the surface of the substrate 21 placed on the second heater 12 is close to, for example, 30 mm or less.

Though not shown, it is possible to provide a heater block on a side facing the substrate of the first heater 11. It is also possible to place the substrate 21 directly on the second heater 12 without providing the heater block 13.

A recessed portion 14 is formed on the surface of the first heater 11 on the substrate 21 side, the recessed portion 14 being formed by a continuously or stepwise varying surface. Further, the first heater 11 has a ventilation opening 14a formed in a central portion of the recessed portion 14.

On the heater block 13, a side block 15 is formed along the side of the substrate 21 placed on the heater block 13. The side block 15 is formed from a heat-conducting material, such as an aluminum-type or copper-type material.

It is possible to individually set the temperatures of the first heater 11 and the second heater 12.

As a means therefor, for example, a first temperature controller 31 is connected to the first heater 11 so that the temperature of the first heater 11 is controlled independently by the first temperature controller 31. Also, a second temperature controller 32 is connected to the second heater 12 so that the temperature of the second heater 12 is controlled independently by the second temperature controller 32. By connecting the first temperature controller 31 and the second temperature controller 32 individually in the manner described above, the temperatures of the first heater 11 and the second heater 12 can be controlled independently. Further, the first temperature controller 31 and the second temperature controller 32 may be formed as a single temperature controller.

In FIG. 2, cross sections of the first heater 11, the heater block 13, and the substrate 21 are shown.

Examples of the recessed portion 14 formed in the first heater 11 will be described with reference to FIG. 3A to FIG. 3F.

Figure 3A:
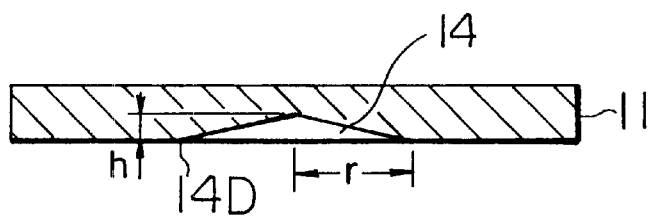
FIGS. 3A to 3F are illustrations of a recessed portion formed in a first heater.
Figure 3B:
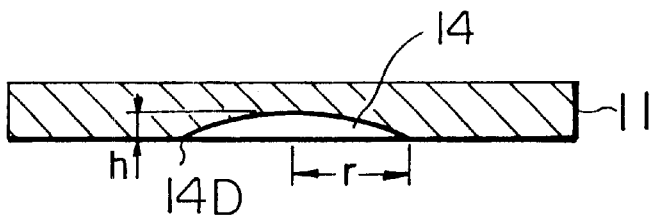
Figure 3C:
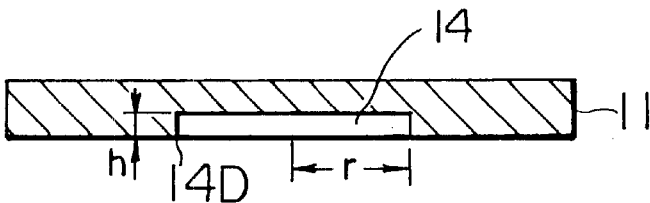
Figure 3D:
Figure 3E:
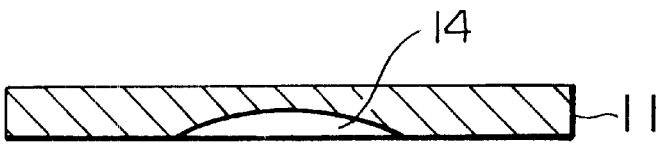
Figure 3F:
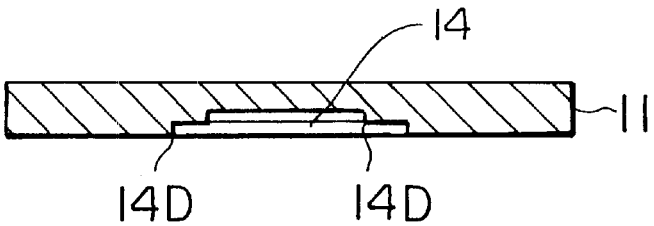

As shown in FIG. 3F, the recessed portion 14, which is a cone-shaped space, is formed in a part of the surface (the bottom surface in the drawing) of the first heater 11 facing the substrate (not shown). The diameter (or radius) R of an opening 14D of the recessed portion 14 is set in the range of $0.5r \leq R \leq 1.4r$ when the diameter (or radius) of the inscribed circle with respect to the external shape of the square substrate in a state in which the square substrate (not shown)

heated by the substrate heating apparatus 1 is seen in plane view is denoted as r. In the opening 14D in this example, the height of the cone-shaped space is set at 4 mm and the radius r of the opening is set at 76 mm for a square substrate of a 152 mm square.

The radius of the opening 14D of the recessed portion 14 is set at from one half of the radius of a circular substrate to the radius of the circular substrate for a case in which the substrate 21 heated by the substrate heating apparatus 1 is a circular substrate (including a substrate on which an orientation flat or notch is formed), such as a silicon wafer.

In another example, as shown in FIG. 3B, a dome-shaped recessed portion 14 formed as part of a spherical shape is formed in a part of the surface (the bottom surface in the drawing) of the first heater 11 facing the substrate (not shown). The radius R of the opening 14D of the recessed portion 14 is set in the range of $0.5r \leq R \leq 1.4r$ when the radius of the inscribed circle with respect to the external shape of this square substrate in a state in which the square substrate (not shown) heated by the substrate heating apparatus 1 is seen in plane view is denoted as r. In the opening 14D in this example, the height of the cone-shaped space is set at 3 mm and the radius r of the opening is set at 76 mm for the square substrate of a 152 mm square.

The radius of the opening 14D of the recessed portion 14 is set at from one half of the radius of this circular substrate to the radius of the circular substrate for a case in which the substrate 21 heated by the substrate heating apparatus 1 is a circular substrate (including a substrate on which an orientation flat or notch is formed), such as a silicon wafer.

In a further example, as shown in FIG. 3C, a dome-shaped recessed portion 14 formed as a circular-cylinder-shaped space is formed in a part of the surface (the bottom surface in the drawing) of the first heater 11 facing the substrate (not shown). The radius R of the opening 14D of the recessed portion 14 is set in the range of $0.5r \leq R \leq 1.4r$ when the radius of the inscribed circle with respect to the external shape of the square substrate (not shown) in a state in which the square substrate heated by the substrate heating apparatus 1 is seen in plane view is denoted as r. In the opening 14D in this example, the height of the circular-cylinder-shaped space is set at 2 mm and the radius r of the opening is set at 76 mm with respect to a square substrate of a 152 mm square.

The radius of the opening 14D of the recessed portion 14 is set at from one half of the radius of this circular substrate to the radius of the circular substrate for a case in which the substrate 21 heated by the substrate heating apparatus 1 is a circular substrate (including a substrate on which an orientation flat or notch is formed), such as a silicon wafer.

The above-described shapes of the recessed portion 14 are examples. The recessed portion 14 may be formed into other shapes if it is formed as a continuously or stepwise varying surface. For example, as shown in FIG. 3D, the recessed portion 14 may be formed as a part of an ellipsoid-shaped space; as shown in FIG. 3E, the recessed portion 14 may be formed as a part of a non-spherical-shaped space; and as shown in FIG. 3F, the recessed portion 14 may be formed as a plurality of circular-cylinder-shaped spaces (two circular-cylinder-shaped spaces in the drawing) such that the radius of the opening 14D becomes smaller as the height of the opening 14D increases.

Further, the recessed portion 14 may be formed in such a way that a part of the interior thereof is formed into a projecting shape. Examples of the shape of such a recessed portion will be described below with reference to FIG. 4.

Figure 4:
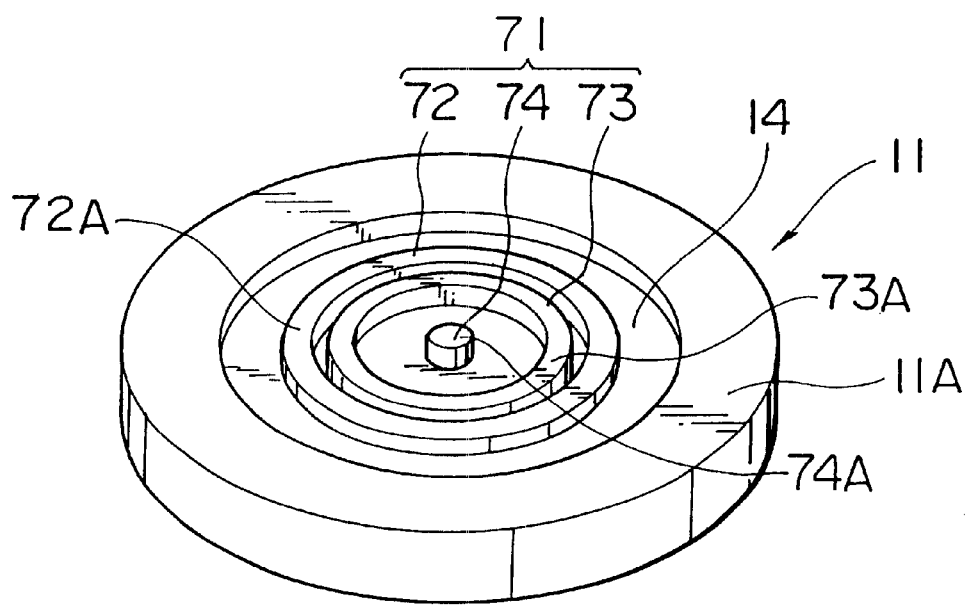
FIG. 4 is an illustration of the shape of a projecting portion provided in the recessed portion.

In FIG. 4, the first heater 11 is shown in a sectional perspective view when seen from the substrate 21 located above.

As shown in FIG. 4, a part of the bottom 14A of the recessed portion 14 formed as a circular-cylindrical space is formed into a projecting shape. Hereinafter, that portion formed into a projecting shape will be referred to as a projecting portion 71. The projecting portion 71 shown in this figure is formed of ring portions 73 and 73 such that, for example, the outer section has a rectangular cross section and a ring-shaped shape, and also includes a circular-cylinder-shaped portion 74. Further, the projecting portion 71 is formed inside the recessed portion 14. More specifically, each of the surfaces 72A, 73A and 74A on the substrate 21 side of the projecting portion 71 has a height equal to that of the surface 11A on the substrate 21 side of the first heater 11 and are present inside the recessed portion 14.

The cross-sectional shape of the projecting portion 71 is not limited to the above-described rectangular cross section and may be of shapes other than the rectangular cross section, for example, a cross section having a curvature (e.g., a half-circular cross section, a semi-half-circular cross section, and so on) or a polygonal cross section. Further, the projecting portion 71 may be formed in such a way that a plurality of ring-shaped projecting portions are arranged. The arrangement thereof may be in a concentric form or in a scattered form.

Further, though not shown, the projecting portion 71 is formed of a plurality of projecting portions, and each of them has a rectangular outer shape cross section and is formed into a semi-rectangular parallelepiped. Each projecting portion is arranged, for example, as a circular shape inside the recessed portion 14. More specifically, the surface of each projecting portion on the substrate 21 side is formed with a height equal to that of the surface 11A of the first heater 11 on the substrate 21 side and in such a manner as to be present inside the recessed portion 14.

The arrangement of the projecting portion 71 is not limited to a circular shape and may be in the form of lattice points or other shapes. Further, the projecting portion 71 may be formed in such a way that a plurality of projecting portions are arranged in a circular shape. The arrangement thereof may be in a concentric form or in a scattered form.

Since the above-described substrate heating apparatus 1 comprises the first heater 11 for heating a placed substrate 21 from the obverse surface thereof and a second heater 12 for heating the substrate 21 from the rear surface thereof, the substrate 21 is heated from the obverse and rear surfaces. Further, the distance between the surface of the substrate 21 and the first heater 11 is small. Therefore, heat loss on the surface of the substrate 21 is suppressed, and the temperature of the surface of the substrate 21 reaches a stable temperature at an early stage.

Since the first temperature controller 31 is connected to the first heater 11 and the second temperature controller 32 is connected to the second heater 12 so that the temperatures of the first heater 11 and the second heater 12 can be controlled individually, the temperatures of the first heater 11 and the second heater 12 are set individually. Therefore, it becomes possible to set the surface temperature of the substrate 21 to any desired value.

Since the recessed portion 14 formed from a continuously or stepwise varying surface is formed on the surface of the first heater 11 on the substrate 21 side, uniform heat radiation can be obtained on the surface of the substrate 21. Therefore, the surface of the substrate 21 is heated uniformly.

Furthermore, since the recessed portion 14 is provided on the surface of the first heater 11 on the substrate 21 side and the radius R of the opening 14D of the recessed portion 14 is set in the range of $0.5r \leq R \leq 1.4r$ when the radius of the inscribed circle with respect to the external shape of a square substrate (not shown) in a state where the square substrate heated by the substrate heating apparatus 1 is seen in plane view is denoted as r, heat loss in the outer peripheral portion of the substrate 21 is cancelled. Therefore, the substrate 21 is heated almost uniformly. Further, the surface of the substrate reaches an almost uniform temperature also for the circular substrate in a similar manner as described above.

Further, since the side block 15 is placed on the heater block 13 lateral to where the substrate 21 is placed, heat loss due to convection in the side peripheral portion of the substrate 21 is reduced.

Furthermore, since the heater block 13 is provided, the heat of the second heater 12 is made uniform by this heater block 13, an almost uniform temperature is achieved on the entire surface on which the substrate is placed, and the substrate 21 is heated in that temperature state.

Figure 5:
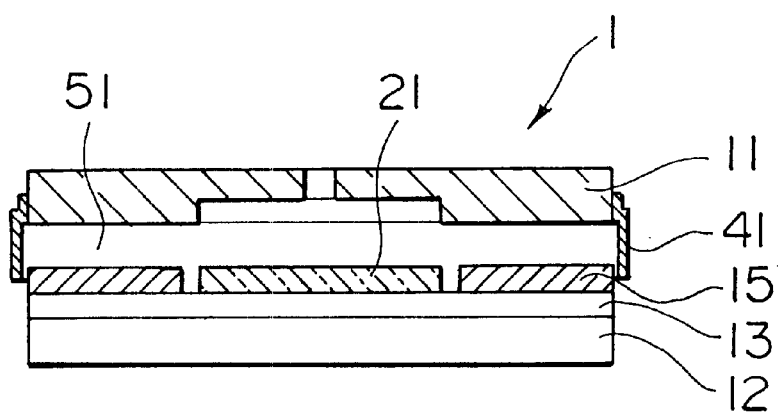
FIG. 5 is a schematic view of a second embodiment of a substrate heating apparatus.

In a second embodiment of the substrate heating apparatus 1, a substrate heating apparatus having improved heat insulation will be described with reference to the schematic view of FIG. 5. In FIG. 5, the illustration of the first temperature controller 31 and the second temperature controller 32 is omitted.

Figure 1:
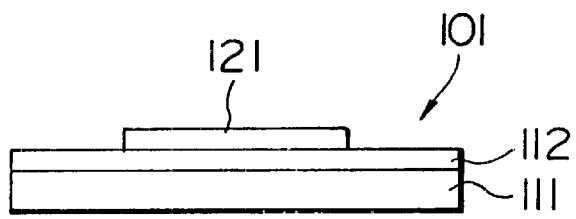
FIG. 1 is a schematic view of a conventional substrate heating apparatus.

As shown in FIG. 5, the substrate heating apparatus is provided with a side wall 41 around the entire circumference on each side peripheral portion of the first heater 11 and the side block 15 in the substrate heating apparatus 1 described in FIG. 1. This side wall 41 is formed from stainless steel having a height of, for example, about 20 mm.

The material of the side wall is not limited to stainless steel, and the side wall may be formed from other metallic materials or a ceramic material.

The outer shapes of the first heater 11, the second heater 12, the heater block 13 and the side block 15 described here are formed into, for example, a circular shape when seen in plane view.

In FIG. 5, cross sections of the first heater 11, the heater block 13, the substrate 21 and the side wall 41 are shown.

In the arrangement in which the side wall 41 is provided as described above, the space formed below the first heater 11 is surrounded by the first heater 11, the heater block 13, the side block 15 and the side wall 41. Therefore, the side wall 41, together with the first heater 11 and the heater block 13, forms a circular-cylindrical heating space 51.

Since the side wall 41 is provided as in the above-described arrangement, the heating space 51 formed between the first heater 11 and the heater block 13 on the second heater 12 is hermetically sealed, and the heating space 51 is formed into a circular-cylindrical shape. Therefore, uniform heat radiation can be obtained on the substrate 21.

Next, another construction of the second heater 12 will be described with reference to the schematic view of FIG. 6.

Figure 6:
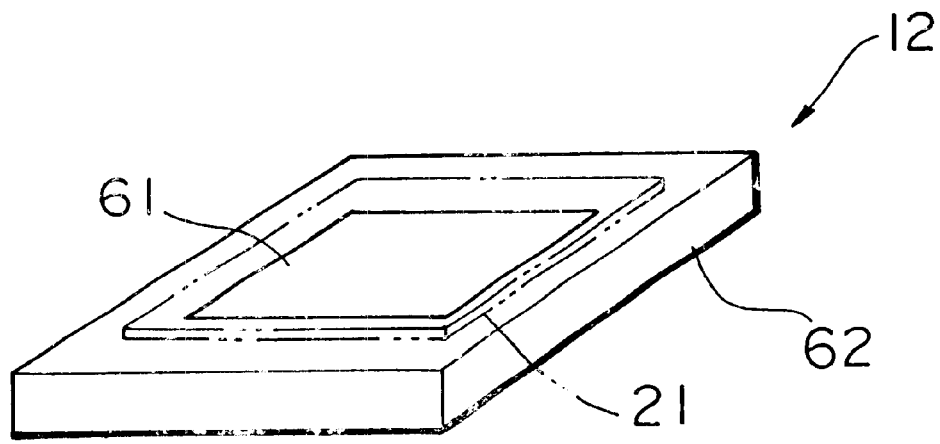
FIG. 6 is a schematic view of the construction of a second heater.

As shown in FIG. 6, the second heater 12 comprises a third heater 61 which constitutes the central portion and the area adjacent to the central portion of the second heater 12, and a fourth heater 62 disposed around the side peripheral portion of the third heater 61. Temperature control sections for individually controlling temperature are each connected to the third heater 61 and the fourth heater 62.

With the above-described arrangement, since the second heater 12 is formed of the third heater 61 and the fourth heater 62 disposed around the side peripheral portion of the third heater 61, it becomes possible to control the temperatures of the third heater 61 and the fourth heater 62 individually. Therefore, heating from the rear surface of the substrate 21 is controlled so that the temperature distribution on the surface of the substrate 21 becomes uniform when the substrate 21 is heated to an increased temperature.

The number of the arrangements of the heater in the second heater 12 is not limited to two divisions in the manner as described above and may be three or more divisions.

Next, the substrate heating method of the present invention will be described below with reference to FIG. 7.

Figure 7:
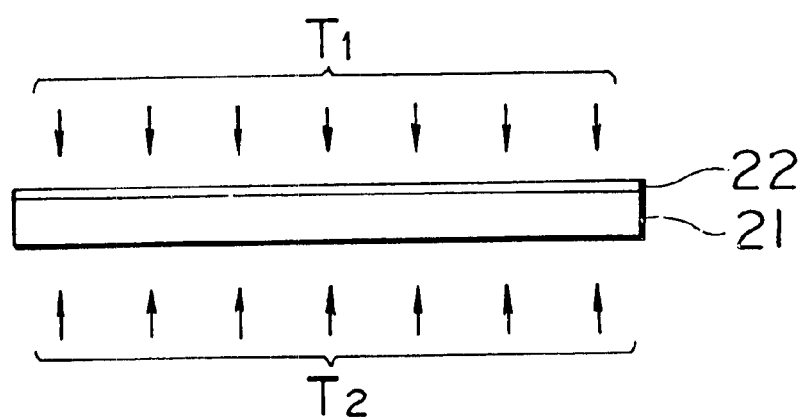
FIG. 7 is an illustration of a substrate heating method of the present invention.

As shown in FIG. 7, the substrate heating method is a method of heating the substrate 21 from the obverse surface thereof at temperature $T_1$ before or after irradiation of light for forming a pattern using a photosensitive material 22 formed on the substrate 21, or before or after irradiation of charged particles for forming a pattern using a material (not shown) which is photosensitive to charged particles formed on the substrate 21, and heating from the rear surface of the substrate 21 to a temperature state independent of heating from the obverse surface of the substrate 21.

The temperatures $T_1$ and $T_2$ are set so as to satisfy the relation of $0.7 \leq T_1/T_2 \leq 1.6$.

In the above-described substrate heating method, since the substrate is heated at a temperature $T_2$ from the rear surface thereof and the substrate is heated at a temperature $T_1$ from the obverse surface to a temperature state independent of the heating from the rear surface of the substrate, heat loss from the surface of the substrate is suppressed, and the surface temperature of the substrate 21 reaches a stable temperature at an early stage. Further, the surface temperature of the substrate 21 reaches a desired temperature and a desired temperature distribution is formed by appropriately setting the ratio of temperature $T_1$ to temperature $T_2$.

Further, since the temperatures $T_1$ and $T_2$ are set so as to satisfy the relation of $0.7 \leq T_1/T_2 \leq 1.6$, the surface of the substrate 21 is heated uniformly. Therefore, dimensional variations in the pattern are reduced to less than the conventional dimensional variations in the pattern.

If the temperatures are set to $T_1/T_2 < 0.7$, since the temperature on the obverse surface of the substrate 21 becomes very low, the heating of the substrate 21 is the same as heating only from the rear surface thereof. Since this is the same as the conventional heating method, it becomes difficult to make the surface temperature of the substrate 21 to have a uniform temperature distribution. Also, when the temperatures are set to $1.6 < T_1/T_2$, the temperature on the rear surface of the substrate 21 becomes very low, and the heating of the substrate 21 is the same as heating only from the obverse surface thereof, and it becomes difficult to make the surface temperature of the substrate 21 to have a uniform temperature distribution.

In order to realize the above-described substrate heating method, the substrate heating apparatus 1 having the construction described in FIGS. 2, 3C and 5 is used.

A description will be given below of a method of heating the substrate 21 in a case in which the substrate heating apparatus 1 is used.

In this description, as an example, for the substrate 21 to be heated, a glass substrate for a photomask was used. This substrate 21 is formed from quartz glass, and there are two types: a square substrate, called a 6025 substrate of a 6 inch (152 mm) square having a thickness of 0.25 inch (6.25 mm), and a square substrate, called a 5009 substrate of a 5 inch (127 mm) square having a thickness of 0.09 inch (2.29 mm).

In the first embodiment, a chromium (Cr) film, about 100 nm thick, is formed on the 6025 substrate, and further, a chemical amplification-type electron beam negative resist is coated to a thickness of 400 nm by a rotational coating method.

Thereafter, the 6025 substrate was baked. The set baking conditions were, for example, a temperature atmosphere of 105° C. and a baking time of 12 minutes. Then, by using a vector scanning-type electron beam drawing apparatus (acceleration voltage: 20 kV), a line and space pattern having a line width of 1.0 µm and a pitch of 1:1 was drawn.

As heating conditions after drawing, the substrate 21 was heated by using the substrate heating apparatus 1 having the construction described in FIGS. 2, 3C and 5, wherein the first heater is used in which a recessed portion which is a circular-cylindrical space is formed. The space between the surface of the substrate 21 and the first heater 11 at that time was set at 1 mm, and the temperature ratio of the temperature $T_1$ of the first heater 11 to temperature $T_2$ of the second heater 12 was set at $T_1/T_2=1.1$.

After the substrate 21 was heated under the above-described conditions, the substrate 21 was cooled to the room temperature (e.g., 23° C.). Then, spray development for 4 minutes was performed using a tetramethylammonium hydroxide aqueous solution (0.38N).

Figure 8:
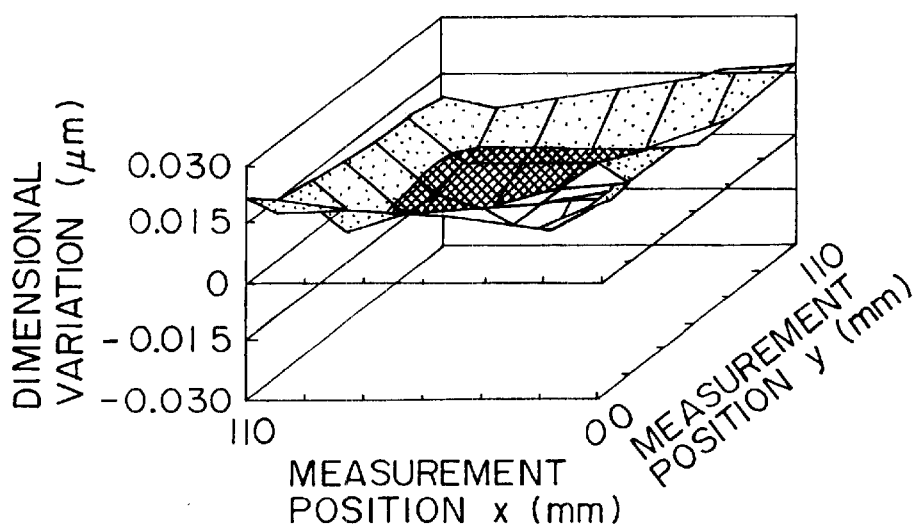
FIG. 8 is a resist pattern dimensional variation distribution view in accordance with the first embodiment of the present invention.

The relationship between the dimensional variations in the thus obtained resist pattern after being developed and the measurement positions is shown in the resist pattern dimensional variation distribution view of FIG. 8. In FIG. 8, the vertical axis shows the differences from the reference dimension (line width=1.0 µm), i.e., the dimensional variations, and the horizontal axis x and the horizontal axis y show the measurement positions within the effective area (110 mm squared) in the photomask.

It can be confirmed as shown in FIG. 8 that the dimensional variations in a resist pattern occur in an almost concentric form from the center to the outer peripheral portion. This shows that the surface temperature distribution of the substrate 21 can be set to a desired distribution state by appropriately setting the space between the first heater 11 and the substrate 21, the temperature $T_1$ of the first heater 11 and the temperature $T_2$ of the second heater 12.

In a second embodiment, an etching step for a chromium film was performed by using a resist pattern formed on the 6025 substrate in order to form a chromium pattern. Regarding heating conditions after drawing in this example, a temperature ratio $T_1/T_2$ of the temperature $T_1$ of the first heater 11 to the temperature $T_2$ of the second heater 12 was 0.9, and a condition was used under which a resist pattern having a uniform line width such that the resist pattern obtained after being developed does not tend to be concentric can be obtained. The other conditions were the same as those described in the first embodiment.

In normal fine pattern formation, the etching speed in the outer peripheral portion of the substrate 21 increases due to a phenomenon known as a loading effect in dry etching which is one of the etching steps. For this reason, occurrence of variations in the pattern dimensions presents a problem.

Figure 9:
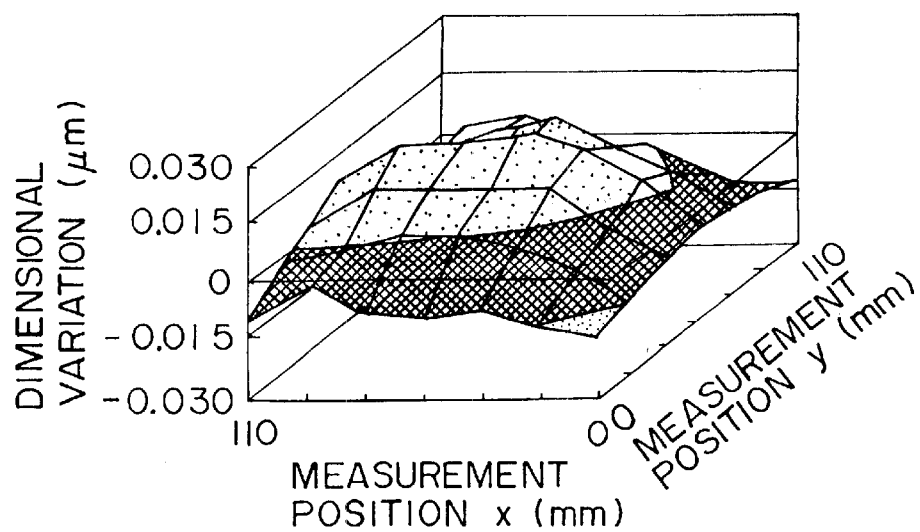
FIG. 9 is a chromium pattern dimensional variation distribution view in accordance with the second embodiment of the present invention.

The chromium pattern dimensional variation distribution view shown in FIG. 9 shows the line width distribution of the chromium pattern formed after dry etching. In FIG. 9, the vertical axis shows differences from the reference dimension (line width=1.0 µm), i.e., dimensional variations, and the horizontal axis x and the horizontal axis y show the measurement positions within the effective area (a 110 mm square) in the photomask.

It can be seen in FIG. 8 that, due to the loading effect, there are positive dimensional variations on the central portion side and negative dimensional variations toward the peripheral portion. As described above, it was found that there is a distribution which is characteristic of the etching step. For the etching conditions, a parallel plate-type reactive ion etching apparatus was used, a mixture gas of oxygen ($O_2$) and chlorine ($Cl_2$) was used as the etching gas, the mixture ratio was set at $O_2/Cl_2=1:7$, the RF output was at 250W, and the etching atmosphere was at 16 Pa.

As a result, the dimensional variations in the chromium pattern were $3\sigma=0.027$ µm.

In a third embodiment, in order to cancel the influence of the loading effect due to etching, the chromium film formed on the substrate was etched under the etching conditions described in the second embodiment by using the resist pattern made under the same conditions as the heating conditions of the first embodiment.

Figure 10:
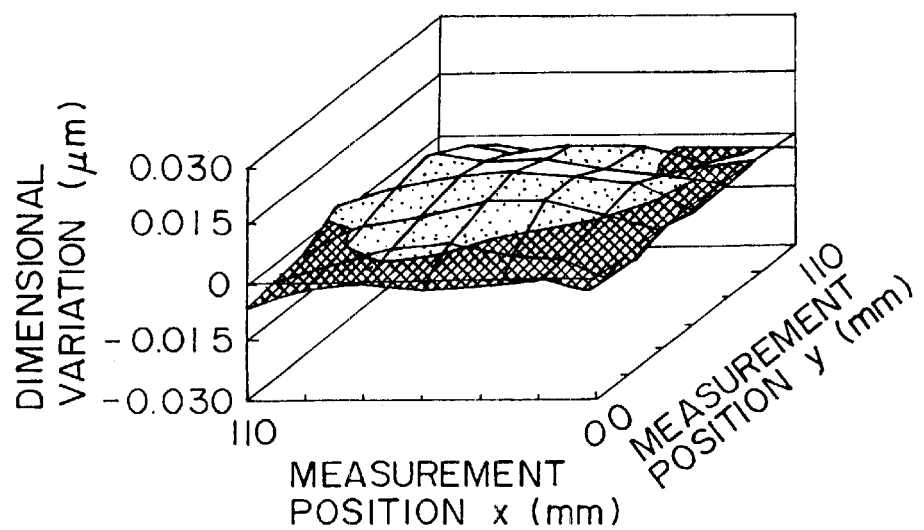
FIG. 10 is a chromium pattern dimensional variation distribution view in accordance with a third embodiment of the present invention.

In this way, results such as those shown in FIG. 10 were obtained. In FIG. 10, the vertical axis shows differences from the reference dimension (line width=1.0 µm), i.e., the dimensional variations in the chromium pattern, and the horizontal axis x and the horizontal axis y show the measurement positions within the effective area (a 110 mm square) in the photomask.

The dimensional variations in the chromium pattern obtained here were $3\sigma=0.014$ µm. That is, it was confirmed that the dimensional variations can be reduced by 52%. This is due to the fact that the heating conditions were set so that the dimension distribution of the resist pattern is such that it cancels the loading effect which occurs in etching.

Since it becomes possible to make the dimensional distribution of the resist pattern into a desired distribution state by appropriately setting the heating conditions as described above, variations in the pattern dimensions after etching are minimized.

In a fourth embodiment, formation of a resist pattern on a 6025 substrate will be described below.

A chromium film, about 100 nm thick, was formed on a 6025 substrate by sputtering in a similar manner as described in the first embodiment. Then, a chemical amplification-type electron beam negative resist was coated to a thickness of 400 nm by a rotational coating method.

In this fourth embodiment, thereafter, the 6025 substrate was baked under the following conditions: a temperature atmosphere of 105° C. and a baking time of 12 minutes. Then, a line and space pattern having a line width of 1.0 µm and a pitch of 1:1 was drawn using a vector scanning-type electron beam drawing apparatus (acceleration voltage: 20 kV).

After drawing, in a similar manner as described in the first embodiment, a heater in which the recessed portion 14 having a circular-cylindrical space was formed was used, and a substrate 21 was heated by using the substrate heating apparatus 1 described in FIGS. 2, 3C and 5. The space between the surface of the substrate 21 and the first heater 11 was set at 1 mm. In this fourth embodiment, the heating temperature was set at 105° C., the heating time at 12 minutes, and the temperature ratio of the temperature $T_1$ of the first heater 11 to the temperature $T_2$ of the second heater 12 at 0.9.

After the substrate 21 was heated under the above-described conditions, the substrate 21 was cooled to room temperature (e.g., 23° C.). Thereafter, spray development for four minutes was performed using a tetramethylammonium hydroxide aqueous solution (0.38N).

As a result, a resist pattern dimensional variation distribution view such as that shown in FIG. 10 was obtained. In FIG. 10, the vertical axis shows differences from the reference dimension (line width=1.0 μm), i.e., dimensional variations, and the horizontal axis x and the horizontal axis y show the measurement positions within the effective area (a 110 mm square) in the photomask.

Figure 11:
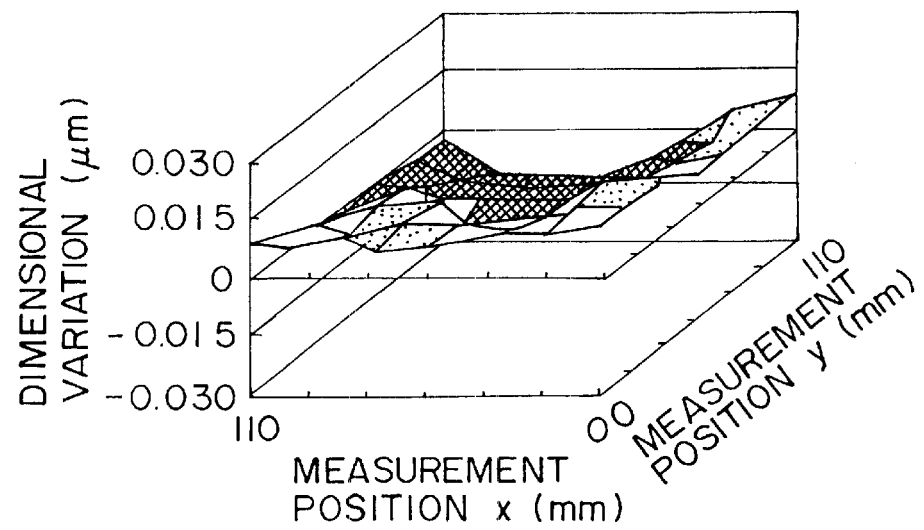
FIG. 11 is a chromium pattern dimensional variation distribution view in accordance with a fourth embodiment of the present invention.

It can be seen in FIG. 11 that the dimensional variations were greatly reduced. In this case, the dimensional variations in the developed resist pattern were $3\sigma=0.018$ μm, and it was confirmed that the dimensional variations can be reduced to 40% by improving the uniformity of temperature in comparison with the dimensional variations in the resist pattern of $3\sigma=0.045$ μm in a case in which the conventional heating apparatus was used.

Next, a fifth embodiment to a twelfth embodiment will be described below. Concerning the processing conditions, conditions other than the heating temperature, the heating time, the temperature ratio $T_1/T_2$ of the temperature $T_1$ of the first heater 11 to the temperature $T_2$ of the second heater 12, as shown in Table 2, were set in the same manner as in the first and second embodiments.

As a result, the dimensional variations in the developed resist pattern are shown in Table 1. For each condition, the dimensional variations were reduced to less than the dimensional variations of $3\sigma=0.045$ μm in the resist pattern formed by the conventional heating method.

TABLE 1

| Embodiment | Heating Temperature (° C.) | Heating Time (min) | Temperature Ratio $T_1/T_2$ | Dimensional Variation $3\sigma$ (μm) | Concentration of Developing Solution (N) |
|---|---|---|---|---|---|
| 5 | 50 | 90 | 0.8 | 0.023 | 0.38 |
| 6 | 90 | 30 | 0.8 | 0.020 | 0.38 |
| 7 | 100 | 15 | 0.9 | 0.016 | 0.38 |
| 8 | 110 | 8 | 0.9 | 0.021 | 0.38 |
| 9 | 110 | 12 | 0.9 | 0.019 | 0.38 |
| 10 | 110 | 15 | 0.9 | 0.017 | 0.38 |
| 11 | 150 | 10 | 1.1 | 0.023 | 0.54 |
| 12 | 200 | 6 | 1.3 | 0.031 | 0.54 |

It is preferable that the range of the temperature ratio $T_1/T_2$ be set in the range of $0.7 \leq T_1/T_2 \leq 1.6$.

By setting $T_1/T_2$ in the above-described range, the surface of the substrate 21 is heated almost uniformly. Therefore, the dimensional variations in the pattern are reduced to less than the conventional dimensional variations in the pattern.

When the temperature ratio is set to $T_1/T_2<0.7$, since the temperature $T_1$ of the first heater 11 on the obverse surface of the substrate 21 is much lower than the temperature $T_2$ on the rear surface of the substrate 21, the effect of heat loss from the surface of the substrate 21 tends to decrease.

When, on the other hand, the temperature ratio is set to $1.6 \leq T_1/T_2$, since the temperature $T_2$ on the rear surface of the substrate 21 is very low, it becomes difficult to obtain a stable substrate surface temperature distribution for a substrate having a large thermal capacity.

TABLE 2

| Embodiment | Heating Temperature (° C.) | Heating Time (min) | Temperature Ratio $T_1/T_2$ | Dimensional Variation $3\sigma$ (μm) |
|---|---|---|---|---|
| 13 | 90 | 30 | 0.8 | 0.037 |
| 14 | 90 | 30 | 0.9 | 0.028 |
| 15 | 110 | 12 | 0.8 | 0.048 |
| 16 | 110 | 12 | 0.9 | 0.027 |
| 17 | 110 | 12 | 1.0 | 0.025 |
| 18 | 110 | 12 | 1.1 | 0.014 |
| 19 | 110 | 12 | 1.2 | 0.039 |
| 20 | 110 | 12 | 1.0 | 0.043 |
| 21 | 110 | 12 | 1.1 | 0.035 |
| 22 | 110 | 12 | 1.2 | 0.024 |
| 23 | 110 | 12 | 1.4 | 0.034 |

Next, a description will be given of the validity of the limitation of the temperature ratio $T_1/T_2$.

A thirteenth embodiment to a twenty-third embodiment shown in Table 2 show the dimensional accuracy of the chromium pattern obtained by etching a chromium film by using a resist pattern on which a correction effect is performed under heating control. The etching conditions are the same as those described in the second embodiment. The other process conditions are the same as those described in the first embodiment except for the heating temperature, the heating time, the temperature ratio $T_1/T_2$ of the temperature $T_1$ of the first heater 11 to the temperature $T_2$ of the second heater 12 and except that the space between the surface of the first heater 11 and the surface of the second heater 12 was set at 2 mm.

The results shown in Table 2 shows that it is possible to form a desired temperature distribution for each heating condition in order to improve the line width accuracy of the chromium pattern by varying the temperature ratio $T_1/T_2$. When the conventional heating method was used, the dimensional variations in the chromium pattern were $3\sigma=0.053$ μm. Therefore, in the thirteenth embodiment to the twenty-third embodiment, it becomes possible to improve the dimensional accuracy of the chromium pattern more than in the pattern formation technology employing the conventional heating method.

It can be confirmed in the thirteenth to twenty-third embodiments that the optimum value of the temperature ratio $T_1/T_2$ differs depending upon the heating temperature and the space between the first heater 11 and the surface of the second heater 12.

Next, a description will be given of the validity of the distance between the surface of the substrate 21 and the rear surface of the first heater 11.

A twenty-fourth embodiment to a twenty-eighth embodiment shown in Table 3 show the dimensional accuracy in the chromium pattern obtained by etching a chromium film by using a resist pattern on which a correction effect was exercised under heating control. The etching conditions are the same as those described in the second embodiment. The other process conditions are the same as those described in the first embodiment except for the heating temperature, the heating time, the temperature ratio $T_1/T_2$ of the temperature $T_1$ of the first heater 11 to the temperature $T_2$ of the second heater 12, and the space between the first heater 11 and the surface of the substrate 21.

The results shown in Table 3 show that when the distance between the surface of the substrate 21 and the rear surface of the first heater 11 is set at 10 mm or less, a desired temperature distribution can be formed for each heating condition in order to improve the accuracy of the line width of the chromium pattern. In the twenty-eighth embodiment, on the other hand, the dimensional variation is a value slightly better than the dimensional variations, 3σ=0.053 μm, in the chromium pattern when the conventional heating method was used, but almost close to the value of the conventional dimensional variation. Accordingly, if the distance between the surface of the substrate 21 and the rear surface of the first heater 11 is 10 mm or less, it becomes possible to improve the dimensional accuracy in the chromium pattern to better than the pattern formation technology employing the conventional heating method.

TABLE 3

| Embodiment | Heating Temperature (° C.) | Heating Time (min) | Temperature Ratio $T_1/T_2$ | Space Between Substrate and First Heater (mm) | Dimensional Variation 3σ (μm) |
| --- | --- | --- | --- | --- | --- |
| 24 | 110 | 12 | 1.2 | 3 | 0.031 |
| 25 | 110 | 12 | 1.2 | 5 | 0.042 |
| 26 | 110 | 12 | 1.3 | 7 | 0.039 |
| 27 | 110 | 12 | 1.3 | 10 | 0.043 |
| 28 | 110 | 12 | 1.3 | 12 | 0.049 |

Next, in a twenty-ninth embodiment, resist pattern formation on a 5009 substrate will be described below.

Initially, a chromium film, about 100 nm thick, was formed on the 5009 substrate by sputtering. Further, a chemical amplification-type resist was coated into a thickness of 400 nm by a rotational coating method.

Thereafter, baking for 12 minutes was performed in a temperature atmosphere of 105° C. Then, by using a vector scanning-type electron beam drawing apparatus (acceleration voltage: 20 kV), a line and space pattern having a line width of 1.75 μm and a pitch of 1:1 was drawn.

After drawing, the substrate 21 was heated by using the substrate heating apparatus 1 constructed as described in FIGS. 2, 3C and 5, wherein a heater in which the recessed portion 14 which is a circular-cylindrical space was formed is used as the first heater 11. The space between the surface of the substrate 21 and the first heater 11 at that time was set at 1 mm. The set heating conditions were a heating temperature of 105° C., a baking time of 12 minutes, and a temperature ratio $T_1/T_2$ 1.1 of the temperature $T_1$ of the first heater 11 to the temperature $T_2$ of the second heater 12.

After the substrate 21 was heated under the above-described conditions, the substrate 21 was cooled to room temperature (e.g., 23° C.). Thereafter, spray development for four minutes was performed using a tetramethylammonium hydroxide aqueous solution (0.38N).

Figure 12:
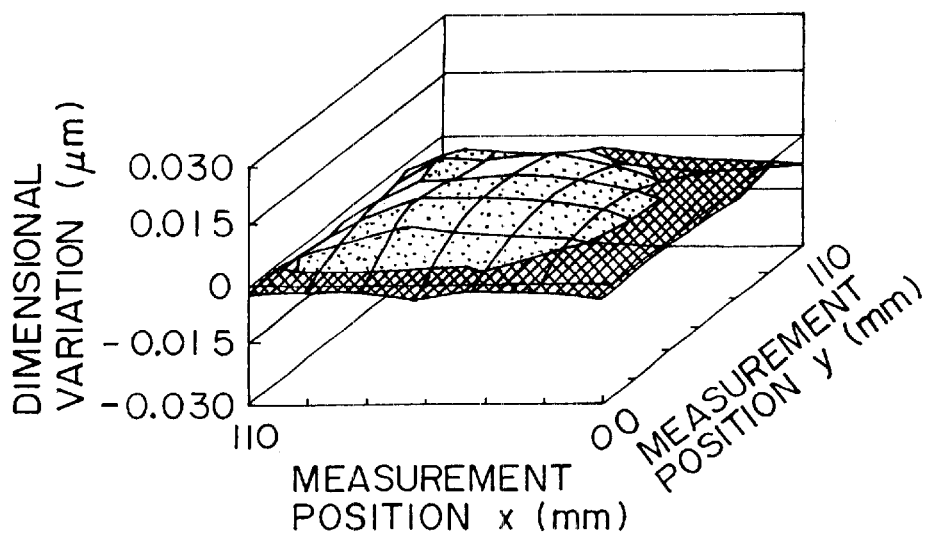
FIG. 12 is a chromium pattern dimensional variation distribution view in accordance with a twenty-ninth embodiment of the present invention.

As a result, a resist pattern dimensional variation distribution view such as that shown in FIG. 12 was obtained. In FIG. 12, the vertical axis shows differences from the reference dimension (line width=1.75 μm), i.e., dimensional variations, and the horizontal axis x and the horizontal axis y show the measurement positions within the effective area (a 110 mm square) in the photomask.

It can be seen in FIG. 12 that the dimensional variations were greatly reduced. In this case, the dimensional variations in the developed resist pattern were 3σ=0.013 μm, and it was confirmed that the dimensional variations can be reduced greatly by improving the uniformity of temperature.

Next, in a thirtieth embodiment, an example of forming a resist pattern on a silicon substrate will be described below.

A silicon wafer of a 6 inch (152 mm) square was used as the substrate 21, and a chemical amplification-type resist was coated into a thickness of 700 nm on the substrate 21 by a rotational coating method.

Thereafter, baking is performed for two minutes in a temperature atmosphere of 90° C. Then, a line and space pattern having a line width of 0.30 μm and a pitch of 1:1 was drawn using a light source having a center wavelength of 248 nm.

After drawing, a substrate 21 was heated by using the substrate heating apparatus 1 constructed as described in FIGS. 2, 3C and 5, wherein a heater in which the recessed portion 14 having a circular-cylindrical space was formed was used. The space between the surface of the substrate 21 and the first heater 11 was set at 1 mm. The heating conditions were set as follows: the heating temperature at 105° C., the heating time at 2 minutes, and the temperature ratio of the temperature $T_1$ of the first heater 11 to the temperature $T_2$ of the second heater 12 at 1.0.

After the substrate 21 was heated under the above-described conditions, the substrate 21 was cooled to room temperature (e.g., 23° C.). Thereafter, spray development was performed for three minutes using a tetramethylammonium hydroxide aqueous solution (0.38N).

Figure 13:
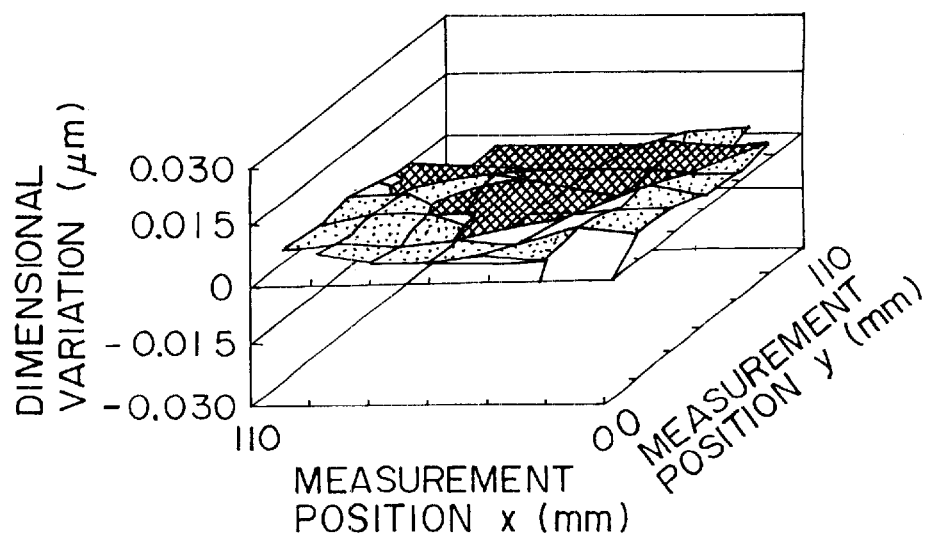
FIG. 13 is a chromium pattern dimensional variation distribution view in accordance with a thirtieth embodiment of the present invention.
Figure 14:
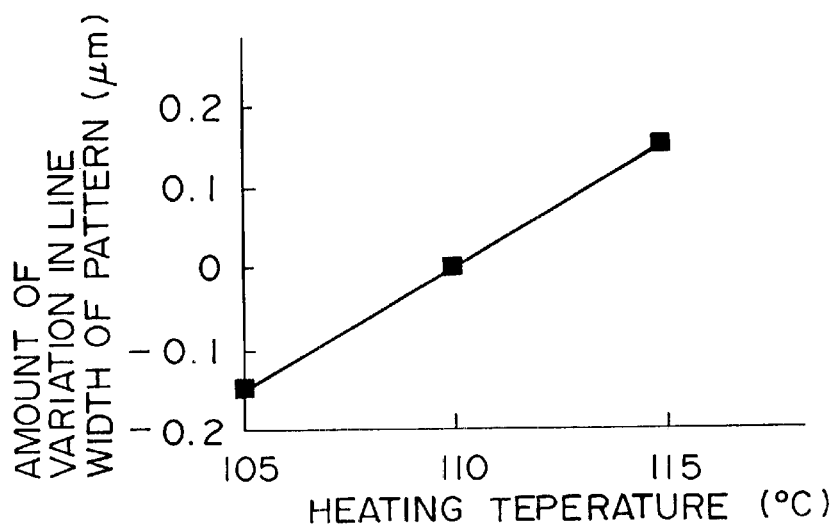
FIG. 14 is a view of the relation between the amount of variation in the line width of a pattern and heating temperature.
Figure 15:
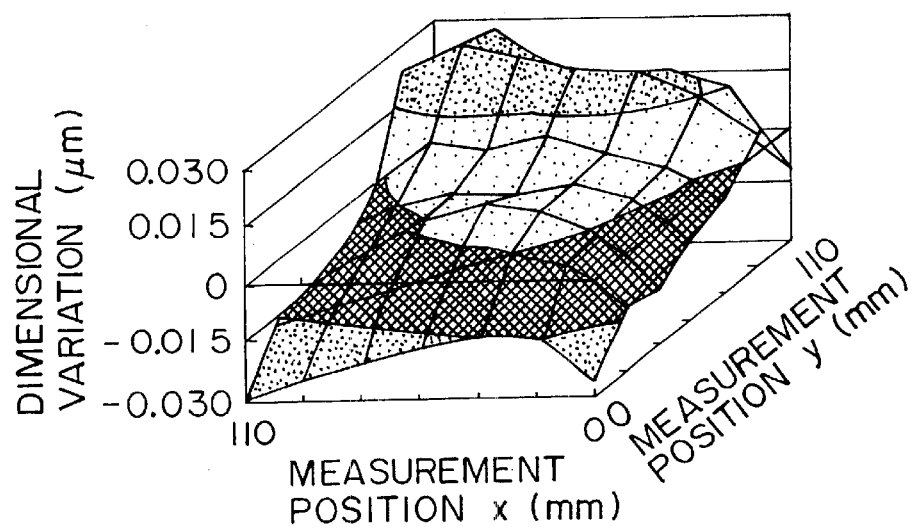
FIG. 15 is a resist pattern dimensional variation distribution view of the prior art.

As a result, a resist pattern dimensional variation distribution view such as that shown in FIG. 13 was obtained. In FIG. 13, the vertical axis shows differences from the reference dimension (line width=0.3 μm), i.e., the dimensional variations, and the horizontal axis x and the horizontal axis y show the measurement positions within the effective area (a 110 mm square) in the wafer.

It can be seen in FIG. 13 that the dimensional variations were greatly reduced. In this case, the dimensional variations in the developed resist pattern were 3σ=0.011 μm, and it was confirmed that the dimensional variations can be reduced greatly by improving the uniformity of temperature.

In the above description, examples are given in which a chemical amplification-type resist which is sensitive to an electron beam is used with focus centered on a glass substrate for a radiation sensitive mask of a specific size. However, the above-described examples are only examples, and the present invention is not limited thereto.

The present invention can be used in manufacturing processes for photomasks and liquid-crystal display devices and in a manufacturing process for semiconductor devices. An effective substrate heating apparatus and substrate heating method are achieved because there is an effect for considerably suppressing a standing wave effect in the portion under the surface of the substrate when making the temperature uniform also in a heating process for any desired photoresist including a chemical amplification-type resist which is photosensitive to electron beams and light.

Next, a description will be given of a product such that the above-described substrate heating apparatus 1 of the present invention is applied to a lithographic process for forming a pattern. In the following description, the same components as those described with reference to FIG. 2 are given the same reference numerals in parentheses.

An example of the above-described product is a semiconductor integrated-circuit device.

The semiconductor integrated-circuit device is formed by heating a substrate in a lithographic process conducted when a pattern which constitutes the semiconductor integrated-circuit is formed on the substrate [e.g., a semiconductor substrate or SOI (Silicon on Insulator) substrate] 21.

The heating is performed by using the substrate heating apparatus 1 which comprises the first heater 11 for heating the substrate 21 from the obverse surface thereof and the second heater 12 for heating the substrate 21 from the rear surface thereof and which is capable of individually setting the temperatures of the first heater 11 and the second heater 12.

In the semiconductor integrated-circuit device, since the substrate is heated in a lithographic process in the manufacture of semiconductor integrated-circuit devices by using the substrate heating apparatus 1 for heating the substrate 21 from both sides thereof, the portion under the surface of the substrate 21 is heated almost uniformly, resulting in a reduction in the dimensional variations of the pattern. Therefore, since a high-precision pattern can be formed, variations in the electrical characteristics caused by dimensional variations in the pattern can be reduced.

An example of the above-described product is a photomask for use in a lithographic process for manufacturing semiconductor devices.

The photomask is formed by heating a substrate in a lithographic process conducted when a pattern is formed on the substrate 21.

The heating is performed by using the substrate heating apparatus 1 which comprises the first heater 11 for heating the substrate 21 from the obverse surface thereof and the second heater 12 for heating the substrate 21 from the rear surface thereof and which is capable of individually setting the temperatures of the the first heater 11 and the second heater 12.

In the photomask, since the substrate is heated by using the substrate heating apparatus 1 for heating the substrate 21 from both sides thereof in a lithographic process conducted in the manufacture of photomasks, the portion under the surface of the substrate 21 is heated almost uniformly, resulting in a reduction in dimensional variations of the pattern.

The above-described liquid-crystal display device is formed by heating a substrate in a lithographic process conducted when a pattern is formed on the substrate 21 which constitutes the liquid-crystal display device.

The heating is performed by using the substrate heating apparatus 1, described with reference to FIG. 2, which comprises the first heater 11 for heating the substrate 21 from the obverse surface thereof and the second heater 12 for heating the substrate 21 from the rear surface thereof and which is capable of individually setting the temperatures of the the first heater 11 and the second heater 12.

In the above-described liquid-crystal display device, since the substrate is heated by using the substrate heating apparatus 1 for heating the substrate 21 which constitutes the liquid-crystal display device from both sides thereof in a lithographic process conducted in the manufacture of photomasks, the portion under the surface of the substrate 21 is heated almost uniformly, resulting in a reduction in dimensional variations of the pattern. Therefore, since a high-precision pattern can be formed, variations in the electrical characteristics and image quality, caused by dimensional variations of the pattern, are reduced.

According to the substrate heating apparatus of the present invention as described above, since a first and a second heater are provided on both sides of the substrate, it becomes possible to heat the substrate from both sides thereof. Therefore, heat loss from the surface of the substrate is suppressed, and the surface temperature of the substrate reaches a stable temperature at an early stage. Further, since the temperatures of the first and second heaters can be set individually, it is possible to set the surface temperature of the substrate to any desired value.

Therefore, in resist pattern formation, it is possible to obtain a resist pattern having a high dimensional accuracy. Also, since the pattern dimension can be made with a desired distribution, it becomes possible to form a pattern having high accuracy through combination with etching. Therefore, it becomes possible to manufacture high-performance devices and photomasks in a high yield.

According to the substrate heating method of the present invention, since the substrate is heated at temperature $T_1$ from the obverse surface thereof and is heated at temperature $T_2$ from the rear surface thereof, heat loss from the surface of the substrate can be suppressed. Therefore, the surface temperature of the substrate reaches a stable temperature at an early stage. Also, regarding the surface temperature of the substrate, a desired temperature distribution can be obtained by appropriately setting the ratio of temperature $T_1$ to temperature $T_2$.

Further, since the temperatures $T_1$ and $T_2$ are set so as to satisfy the relation of $0.7 \leq T_1/T_2 \leq 1.6$, the surface of the substrate can be heated uniformly, and therefore, dimensional variations in the pattern can be reduced to less than conventional dimensional variations in the pattern.

According to the substrate heating apparatus of the present invention, since the substrate is heated in a lithographic process conducted in the manufacture of semiconductor integrated-circuit devices by using a substrate heating apparatus for heating the substrate from both sides thereof, it is possible to heat the portion under the surface of the substrate almost uniformly. Therefore, dimensional variations in the pattern can be reduced, and a high-precision pattern can be formed, resulting in a reduction in variations of the electrical characteristics caused by dimensional variations in the pattern and resulting in an improved yield.

According to the photomask of the present invention, since a substrate is heated in a lithographic process conducted in the manufacture of photomasks by using a substrate heating apparatus for heating the substrate which constitutes the photomask from both sides thereof, it is possible to heat the portion under the surface of the substrate almost uniformly. Therefore, dimensional variations in the pattern can be reduced, and the yield can be improved.

According to the liquid-crystal display device of the present invention, since the substrate is heated in a lithographic process conducted in the manufacture of liquid-crystal display devices by using a substrate heating apparatus for heating the substrate which constitutes the liquid-crystal display device from both sides thereof, it is possible to heat the portion under the surface of the substrate almost uniformly, resulting in a reduction in dimensional variations. Therefore, since a high-precision pattern can be formed, it is possible to reduce the variations in the electrical characteristics caused by dimensional variations in the pattern and improve the yield.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A substrate heating method, comprising the steps of:

forming a radiation sensitive material into a film on a substrate;

baking said substrate on which said radiation sensitive material is formed into said film, wherein a first surface of said substrate on which said radiation sensitive material is formed into said film is heated at temperature $T_1$ by a first heating source and a second surface, opposite said first surface, of said substrate is simultaneously heated by a temperature $T_2$ by a second heating source, said second heating source controlled independently from said first heating source, said first heating source having a recessed portion formed on a surface of the first heating source on a side facing the substrate, said first surface of said substrate being spaced apart form said first heating source, a distance between said first surface of said substrate and a further recessed part of said recessed portion being 10 mm or less; and patterning said radiation sensitive material by irradiating said radiation sensitive material on said heated substrate with light or charged particles.

2. A substrate heating method according to claim 1, wherein said temperatures $T_1$ and $T_2$ have a relation of $0.7 \leq T_1/T_2 \leq 1.6$.

3. A substrate heating method according to claim 1, further comprising the steps of:

wherein said radiation sensitive material is only formed on a portion of said substrate as a mask;

developing said radiation sensitive material irradiated with said light or said charged particles; and processing said substrate with said developed radiation sensitive material as said mask.

4. A substrate heating method, comprising the steps of:

forming a radiation sensitive material into a film on a substrate;

patterning said radiation sensitive material by irradiating said radiation sensitive material on said substrate with light or charged particles; and braking said substrate after said irradiation of said charged particles or said light, wherein a first surface of said substrate on which said radiation sensitive material is formed into said film is heated at temperature $T_1$ by a first heating source spaced apart from said first surface of said substrate and a second surface, on a different side from said first surface of said substrate, is simultaneously heated at temperature $T_2$ by a second heating source, said second heating source controlled independently from said first heating source, said first heating source having a recessed portion formed on a surface of the first heating source on a side facing the substrate, a distance between said first surface of said substrate and a furthest recessed part of said recessed portion being 10 mm or less.

5. A substrate heating method according to claim 4, wherein said temperatures $T_1$ and $T_2$ have a relation of $0.7 \leq T_1/T_2 \leq 1.6$.

6. A substrate heating method according to claim 4, further comprising the steps of:

wherein said radiation sensitive material is only formed on a portion of said substrate as a mask;

developing said irradiated radiation sensitive material on said heated substrate; and processing said substrate with said developed radiation sensitive material as said mask;

* * * * *